United States Patent
Jun et al.

(10) Patent No.: US 11,591,167 B2
(45) Date of Patent: Feb. 28, 2023

(54) TOWER LIFT

(71) Applicant: SEMES CO., LTD., Cheonan-si (KR)

(72) Inventors: Seung Keun Jun, Anyang-si (KR); Jun Sang Ahn, Yongin-si (KR); Sang Min Lee, Daegu (KR); Eun Sang Yoon, Suwon-si (KR)

(73) Assignee: SEMES CO., LTD, Cheonan-si (KR)

( * ) Notice: Subject to any disclaimer, the term of this patent is extended or adjusted under 35 U.S.C. 154(b) by 614 days.

(21) Appl. No.: 16/396,120

(22) Filed: Apr. 26, 2019

(65) Prior Publication Data

US 2019/0344978 A1    Nov. 14, 2019

(30) Foreign Application Priority Data

May 8, 2018 (KR) .......................... 10-2018-0052637

(51) Int. Cl.
| | |
|---|---|
| *H01L 21/67* | (2006.01) |
| *B65G 47/90* | (2006.01) |
| *H01L 21/677* | (2006.01) |
| *B65G 39/071* | (2006.01) |

(52) U.S. Cl.
CPC .......... *B65G 47/90* (2013.01); *B65G 39/071* (2013.01); *H01L 21/6773* (2013.01); *H01L 21/67706* (2013.01); *H01L 21/67712* (2013.01); *H01L 21/67766* (2013.01)

(58) Field of Classification Search
None
See application file for complete search history.

(56) References Cited

U.S. PATENT DOCUMENTS

| | | | | |
|---|---|---|---|---|
| 3,117,462 A | * | 1/1964 | Davis | ................... B01D 33/067 |
| | | | | 474/104 |
| 2011/0155523 A1 | * | 6/2011 | Legeret | ..................... B66B 5/18 |
| | | | | 188/161 |

FOREIGN PATENT DOCUMENTS

| | | | | |
|---|---|---|---|---|
| CN | 203335159 | | 12/2013 | |
| DE | 3138755 | * | 5/1982 | ............. B65G 15/64 |
| DE | 10-2007-039725 | * | 2/2009 | ............. B65G 23/04 |
| JP | 2009-132510 | | 6/2009 | |
| KR | 10-1854044 | | 5/2018 | |

OTHER PUBLICATIONS

Chinese Office Action, with English translation, corresponding to Chinese Patent Application No. 201910375938.4, dated Jul. 28, 2020.

* cited by examiner

*Primary Examiner* — Ronald P Jarrett

(74) *Attorney, Agent, or Firm* — Kile Park Reed & Houtteman PLLC

(57) ABSTRACT

A tower lift includes a main frame extending in a vertical direction, a carriage module configured to be movable in the vertical direction along the main frame, a weight module disposed behind the carriage module and configured to be movable in the vertical direction along the main frame, a driving module disposed on the main frame and configured to move the carriage module and the weight module in the vertical direction using at least one timing belt, an auto tensioner disposed on a lower portion of the main frame and connected with the carriage module and the weight module by a balance belt, and an upper alignment unit for aligning a horizontal position of the at least one timing belt.

8 Claims, 7 Drawing Sheets

TOWER LIFT

CROSS-REFERENCE TO RELATED APPLICATION

This application claims the priority benefit of Korean Patent Application No. 10-2018-0052637, filed on May 8, 2018, and all the benefits accruing therefrom under 35 U.S.C. § 119, the contents of which are incorporated by reference in their entirety.

BACKGROUND

The present invention relates to a tower lift. More specifically, the present invention relates to a tower lift for vertically transporting an object using a carriage module.

Generally, in a semiconductor or display manufacturing process, a semiconductor wafer or display substrate may be transported in a vertical direction between clean rooms of multiple floors by a tower lift.

The tower lift may include a carriage module for transporting objects, a main frame extending in a vertical direction and to which guide rails for guiding the carriage module are mounted, a weight module disposed behind the carriage module, and a driving module for moving the carriage module and the weight module in the vertical direction using a timing belt. Further, the tower lift may further include a balance belt for connecting the carriage module and the weight module, and an auto tensioner for adjusting a tension of the balance belt. The driving module may include a timing pulley engaged with the timing belt, and the auto tensioner may include pulleys engaged with the balance belt.

However, when the height of the tower lift is increased or the vertical movement speed of the carriage module and the weight module is increased, the timing belt may be disengaged from the timing pulley of the driving module, and the balance belt may be disengaged from the pulleys of the auto tensioner.

SUMMARY

The present invention provides a tower lift capable of preventing a timing belt from being disengaged from a timing pulley of a driving module. Further, the present invention provides a tower lift capable of preventing a balance belt from being disengaged from pulleys of an auto tensioner.

In accordance with some exemplary embodiments of the present invention, a tower lift may include a main frame extending in a vertical direction, a carriage module configured to be movable in the vertical direction along the main frame, a weight module disposed behind the carriage module and configured to be movable in the vertical direction along the main frame, a driving module disposed on the main frame and configured to move the carriage module and the weight module in the vertical direction using at least one timing belt, an auto tensioner disposed on a lower portion of the main frame and connected with the carriage module and the weight module by a balance belt, and an upper alignment unit for aligning a horizontal position of the at least one timing belt.

In accordance with some exemplary embodiments of the present invention, the driving module may include a pair of timing belts having a first end portion connected with the carriage module and a second end portion connected with the weight module, respectively, a timing pulley configured in one piece and having a pair of gear portions engaged with the timing belts, and a driving unit for rotating the timing pulley.

In accordance with some exemplary embodiments of the present invention, the upper alignment unit may include a first upper alignment roller disposed between the timing belts, second upper alignment rollers disposed on both sides of the pair of timing belts, respectively, an upper fixed block to which the first upper alignment roller is mounted, and upper movable blocks to which the second upper alignment rollers are mounted respectively and configured to be movable in a direction parallel with a central axis of the timing pulley.

In accordance with some exemplary embodiments of the present invention, the upper alignment unit may further include second upper fixed blocks disposed on both sides of the upper movable blocks, respectively, and elastic members disposed between the upper movable blocks and the second upper fixed blocks, respectively.

In accordance with some exemplary embodiments of the present invention, the upper alignment unit may further include upper misalignment detection sensors for monitoring positions of the second upper alignment rollers to detect a misalignment state of the timing belts.

In accordance with some exemplary embodiments of the present invention, the auto tensioner may include a fixed pulley disposed below the carriage module and the weight module and on which the balance belt is engaged, and a movable pulley disposed adjacent to the fixed pulley and configured to press an inner side of the balance belt downward to maintain a tension of the balance belt.

In accordance with some exemplary embodiments of the present invention, the tower lift may further include a lower alignment unit for aligning a horizontal position of the balance belt.

In accordance with some exemplary embodiments of the present invention, the lower alignment unit may include lower alignment rollers disposed adjacent to both sides of the balance belt, respectively, to prevent the balance belt from being disengaged from the fixed pulley, and lower movable blocks to which the lower alignment rollers are mounted respectively and configured to be movable in a direction parallel with a central axis of the fixed pulley.

In accordance with some exemplary embodiments of the present invention, the lower alignment unit may further include lower fixed blocks disposed on both sides of the lower movable blocks, respectively, and elastic members disposed between the lower movable blocks and the lower fixed blocks, respectively.

In accordance with some exemplary embodiments of the present invention, the lower alignment unit may further include lower misalignment detection sensors for monitoring positions of the lower alignment rollers to detect a misalignment state of the balance belt.

The above summary of the invention is not intended to describe each illustrated embodiment or every implementation of the present invention. The detailed description and claims that follow more particularly exemplify these embodiments.

BRIEF DESCRIPTION OF THE DRAWINGS

Exemplary embodiments can be understood in more detail from the following description taken in conjunction with the accompanying drawings, in which.

Figure 1:
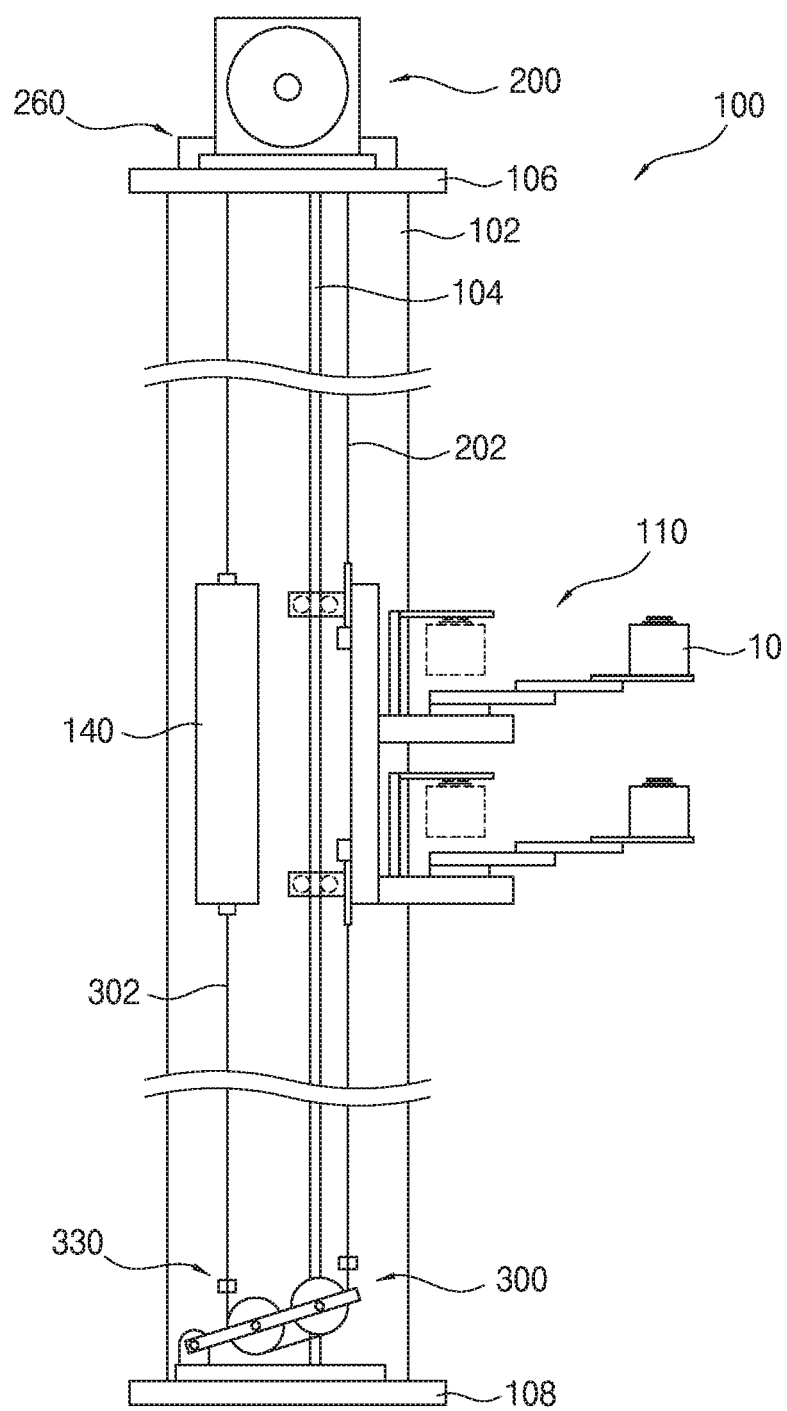
FIG. 1 is a schematic view illustrating a tower lift in accordance with an exemplary embodiment of the present invention.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, embodiments of the present invention are described in more detail with reference to the accompanying drawings. However, the present invention is not limited to the embodiments described below and is implemented in various other forms. Embodiments below are not provided to fully complete the present invention but rather are provided to fully convey the range of the present invention to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present invention, the regions and the layers are not limited to these terms.

Terminologies used below are used to merely describe specific embodiments, but do not limit the present invention. Additionally, unless otherwise defined here, all the terms including technical or scientific terms, may have the same meaning that is generally understood by those skilled in the art.

Embodiments of the present invention are described with reference to schematic drawings of ideal embodiments. Accordingly, changes in manufacturing methods and/or allowable errors may be expected from the forms of the drawings. Accordingly, embodiments of the present invention are not described being limited to the specific forms or areas in the drawings, and include the deviations of the forms. The areas may be entirely schematic, and their forms may not describe or depict accurate forms or structures in any given area, and are not intended to limit the scope of the present invention.

Figure 2:
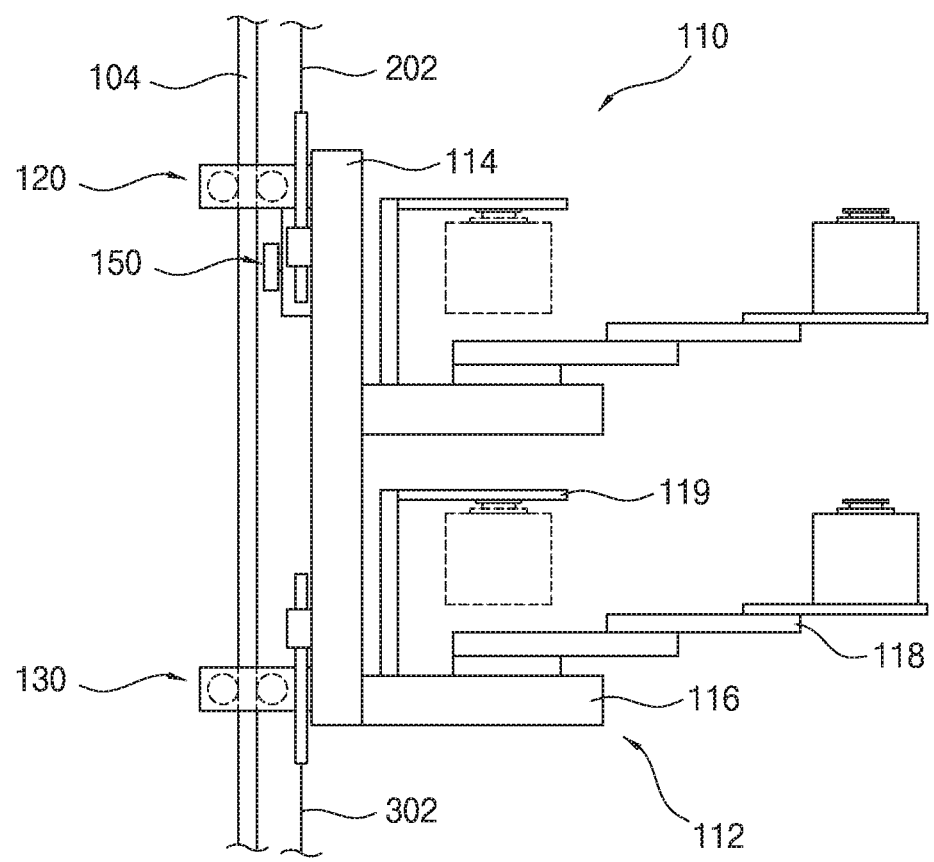
FIG. 2 is a schematic view illustrating a carriage module as shown in FIG. 1.

FIG. 1 is a schematic view illustrating a tower lift 100 in accordance with an exemplary embodiment of the present invention, and FIG. 2 is a schematic view illustrating a carriage module 110 as shown in FIG. 1.

Referring to FIGS. 1 and 2, a tower lift 100, in accordance with an exemplary embodiment of the present invention, may be used to transport objects in a vertical direction. For example, the tower lift 100 may be used to transport semiconductor wafers or display substrates between clean rooms of multiple floors in a vertical direction in a semiconductor or display manufacturing process.

In accordance with an exemplary embodiment of the present invention, the tower lift 100 may include a main frame 102 extending in a vertical direction, a carriage module 110 disposed in front of the main frame 102 and configured to be movable in the vertical direction along the main frame 102, and a driving module 200 disposed on the main frame 102 and connected with the carriage module 110 by timing belts 202 to move the carriage module 110 in the vertical direction. For example, the main frame 102 may include an upper plate 106 and a lower plate 108, and the driving module 200 may be disposed on the upper plate 106.

Further, the tower lift 100 may include guide rails 104 extending parallel to each other in the vertical direction along the main frame 102, and guide units 120 and 130 mounted to the carriage module 110 and guiding the carriage module 110 in the vertical direction along the guide rails 104. For example, the guide rails 104 may be disposed on both side surfaces of the main frame 102, respectively, and upper guide units 120 and lower guide units 130 may be mounted to the carriage module 110 and may be coupled with the guide rails 104.

Still further, the tower lift 100 may include brake modules 150 mounted to the carriage module 110. The brake modules 150 may be brought into close contact with the main frame 102 to prevent the carriage module 110 from falling when the timing belts 202 are broken.

Referring to FIG. 2, the carriage module 110 may include a lift frame 112 having a rear surface to which the upper and lower guide units 120 and 130 and the brake modules 150 are mounted, and carriage robots 118 for handling the objects such as semiconductor wafers or display substrates. For example, the lift frame 112 may include a lift plate 114 having the rear surface and support plates 116 on which the carriage robots 118 are disposed. The carriage robots 118 may handle receiving containers 10, for example, FOUPs (Front Opening Unified Pods) for receiving semiconductor wafers. Further, the carriage module 110 may include holding units 119 for holding the receiving containers 10.

The timing belts 202 may have a first end portion connected to the carriage module 110 and a second end portion connected to a weight module 140, respectively. The weight module 140 may be used to stably move the carriage module 110 in the vertical direction. The weight module 140 may be disposed behind the carriage module 110 and may be configured to be movable in the vertical direction along the main frame 102. Further, the carriage module 110 and the weight module 140 may be connected to each other by a balance belt 302, and an auto tensioner 300 may be disposed on a lower portion of the main frame 102 to apply a predetermined tensile force to the balance belt 302. For example, the auto tensioner 300 may be disposed on the lower plate 108 of the main frame 102.

Particularly, the tower lift 100 may include an upper alignment unit 260 for aligning horizontal positions of the timing belts 202 and a lower alignment unit 330 for aligning a horizontal position of the balance belt 302.

Figure 3:
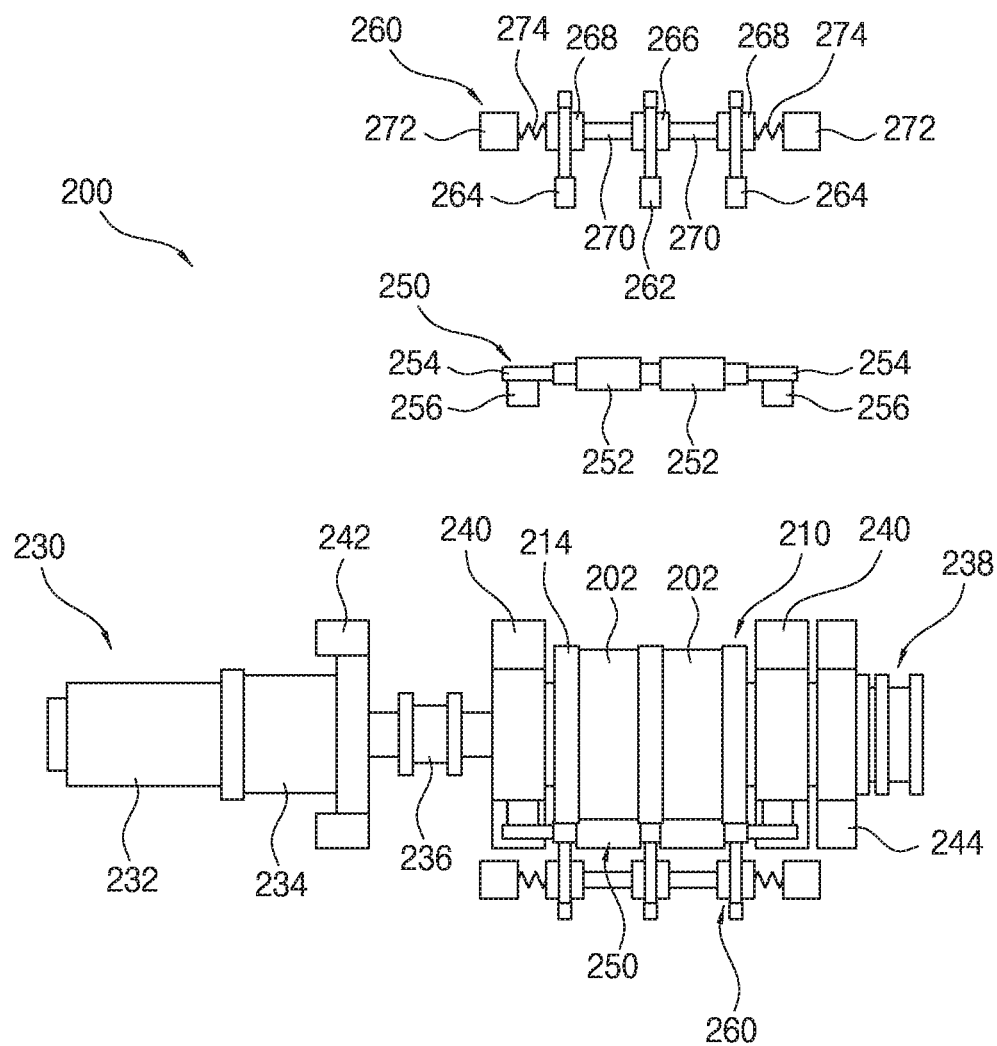
FIG. 3 is a schematic plan view illustrating a driving module as shown in FIG. 1.
Figure 4:
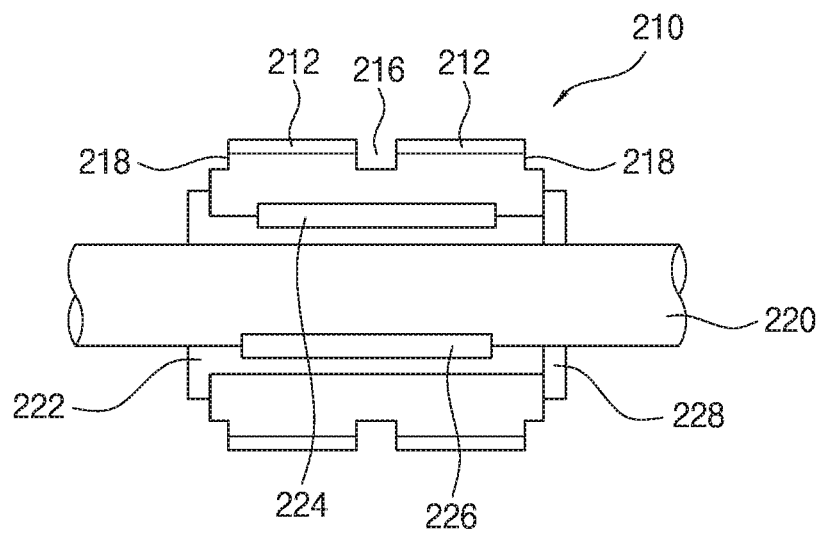
FIG. 4 is a schematic cross-sectional view illustrating a timing pulley as shown in FIG. 3.

FIG. 3 is a plan view illustrating the driving module 200 as shown in FIG. 1, and FIG. 4 is a cross-sectional view illustrating a timing pulley 210 as shown in FIG. 3.

Referring to FIGS. 3 and 4, the driving module 200 may include a plurality of timing belts 202 connected to the carriage module 110 and the weight module 140, a timing pulley 210 configured in one piece and having a plurality of gear portions 212 engaged with the timing belts 202, and a driving unit 230 for rotating the timing pulley 210.

For example, the driving module 200 may include a pair of timing belts 202, and the timing pulley 210 may have a pair of gear portions 212 corresponding to the timing belts 202, respectively. Particularly, the driving module 200 may include guide rings 214 for preventing the timing belts 202 from being disengaged from the gear portions 212 of the timing pulley 210. The guide rings 214 may be disposed between the gear portions 212 and on both sides of the pair of gear portions 212. For example, the timing pulley 210 may have a groove 216 and step portions 218 into which the guide rings 214 are inserted as shown in FIG. 4.

As described above, the timing pulley 210 of the one piece type having the gear portions 212 corresponding to the timing belts 202 may have a relatively high rigidity in comparison with the conventional art, in which a plurality of timing pulleys are used, and the deformation or damage of the timing pulley 210 may thus be sufficiently prevented.

The driving unit 230 may include a motor 232 and a reduction gear 234, and may be connected with a driving shaft 220 through a coupling member 236. The driving shaft 220 may be coupled with the timing pulley 210, and an electromagnetic brake 238 may be connected with the driving shaft 220.

The driving shaft 220 may extend through the timing pulley 210, and a bushing 222 may be disposed between the timing pulley 210 and the driving shaft 220. Further, keys 224 and 226 for transmitting rotational force may be disposed between the timing pulley 210 and the bushing 222 and between the bushing 222 and the driving shaft 220, respectively. The bushing 222 may be coupled to one side of the timing pulley 210 by fasteners such as bolts (not shown), and a flange 228 for fixing the bushing 222 may be coupled to the bushing 222 and another side of the timing pulley 210 by fasteners such as bolts (not shown).

Support brackets 240 for rotatably supporting the driving shaft 220 and a second bracket 242 to which the driving unit 230 is mounted may be disposed on the upper plate 106 of the main frame 102. Further, a third bracket 244 to which the electromagnetic brake 238 is mounted may be disposed on the upper plate 106 of the main frame 102.

In accordance with an exemplary example of the present invention, the tower lift 100 may include pushing units 250 and upper alignment units 260 disposed on both sides of the timing pulley 210, respectively. The pushing units 250 may push outer side surfaces of the timing belts 202 toward inner side surfaces of the timing belts 202 in order to bring the timing belts 202 into close contact with the gear portions 212 of the timing pulley 210. The upper alignment units 260 may align horizontal positions of the timing belts 202. For example, the upper alignment units 260 may be configured to align the timing belts 202 with the gear portions 212 of the timing pulley 210. Meanwhile, in FIG. 3, one of the pushing units 250 and one of the alignment units 260 are shown separately for easy understanding.

Figure 5:
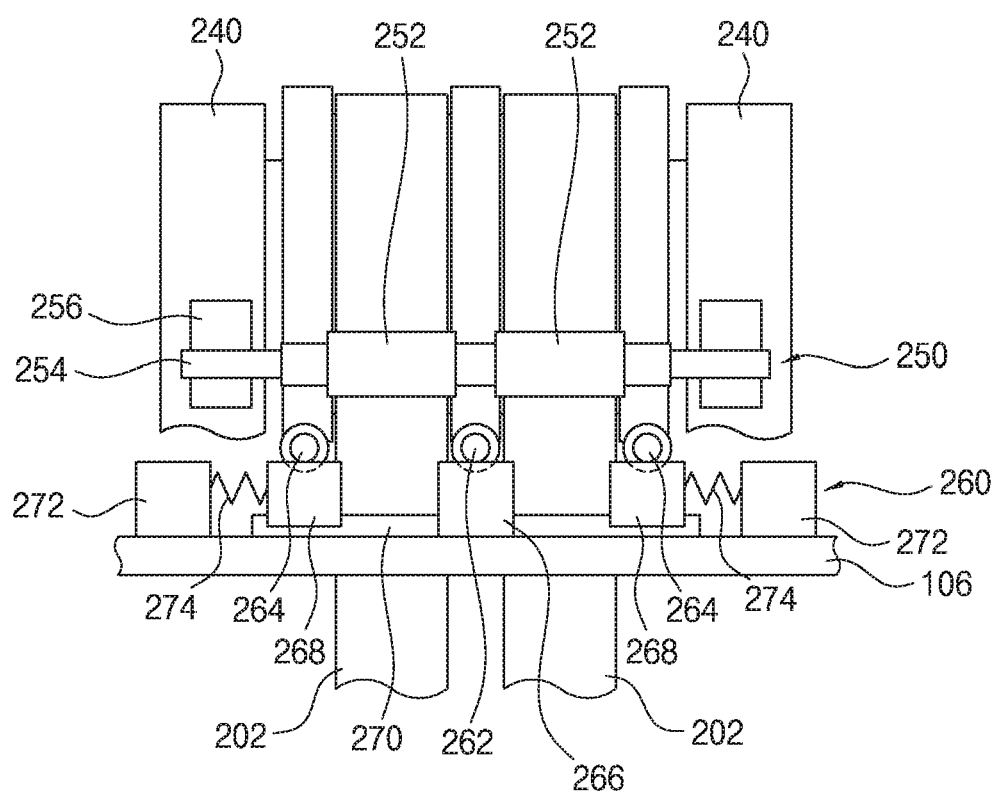
FIG. 5 is a schematic front view illustrating pushing units and upper alignment units as shown in FIG. 3.
Figure 6:
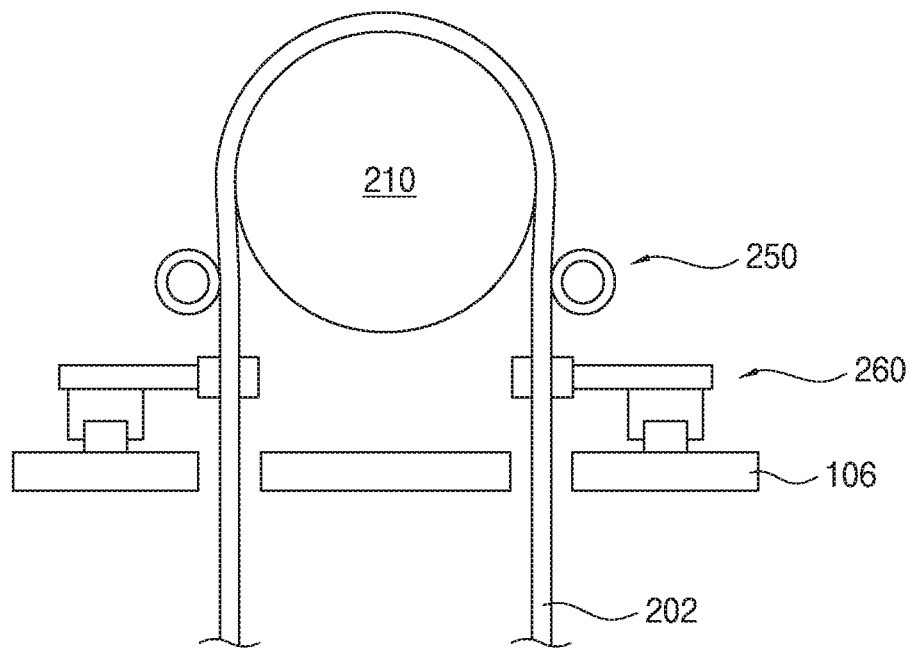
FIG. 6 is a schematic side view illustrating the pushing units and the upper alignment units as shown in FIG. 3.
Figure 7:
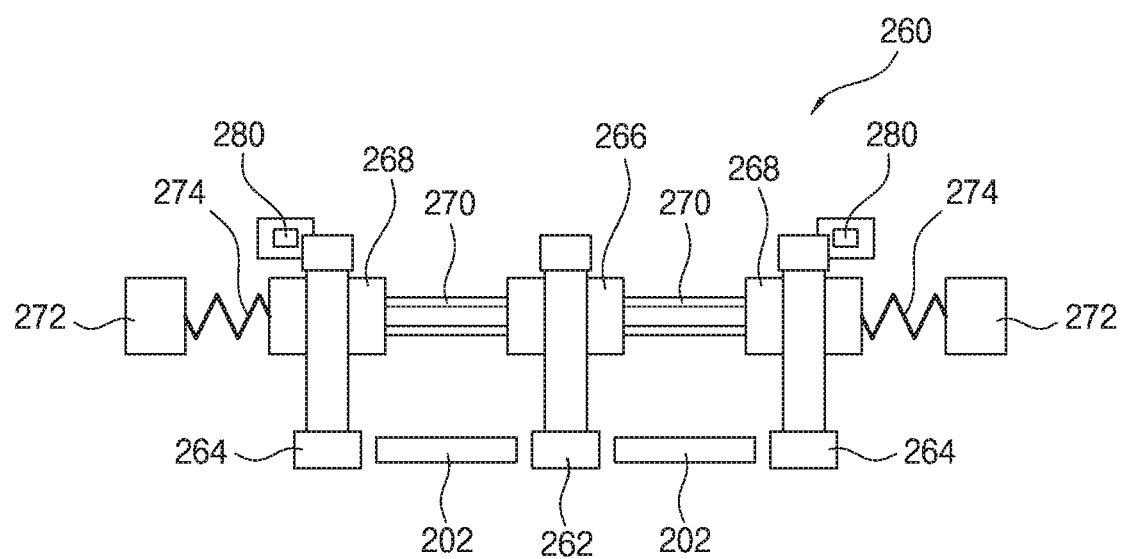
FIG. 7 is a schematic plan view illustrating the upper alignment units as shown in FIG. 3.

FIG. 5 is a front view illustrating the pushing units 250 and the upper alignment units 260 as shown in FIG. 3, FIG. 6 is a side view illustrating the pushing units 250 and the upper alignment units 260 as shown in FIG. 3, and FIG. 7 is a plan view illustrating the upper alignment units 260 as shown in FIG. 3.

Referring to FIGS. 3 and 5 to 7, the pushing units 250 may be disposed lower than a central axis of the timing pulley 210 and may push the outer side surfaces of the timing belts 202 to bring the timing belts 202 into close contact with the gear portions 212 of the timing pulley 210.

For example, each of the pushing units 250 may include pushing rollers 252 for pushing the outer side surfaces of the timing belts 202. For example, the pushing rollers 252 may be brought into close contact with the outer surfaces of the timing belts 202 such that the timing belts 202 are pushed inwardly by about 0.5 mm to 5.0 mm.

The pushing rollers 252 may be mounted to the support brackets 240. For example, fourth brackets 256 may be mounted to side surfaces of the support brackets 240, and rotating shafts 254 coupled with the pushing rollers 252 may be mounted to the fourth brackets 256.

The upper alignment units 260 may be disposed lower than the pushing units 250. For example, each of the upper alignment units 260 may include a first upper alignment roller 262 disposed between the timing belts 202, second upper alignment rollers 264 disposed on both sides of the pair of timing belts 202, respectively, an upper fixed block 266 to which the first upper alignment roller 262 is mounted, and upper movable blocks 268 to which the second upper alignment rollers 264 are each mounted and configured to be movable in a direction parallel with the central axis of the timing pulley 210.

The upper movable blocks 268 may be movably configured by using linear motion guides 270. Particularly, second upper fixed blocks 272 may be disposed on both sides of the upper movable blocks 268, and elastic members 274 such as coil springs may be disposed between the upper movable blocks 268 and the second upper fixed blocks 272, respectively. As a result, the timing belts 202 may be prevented from being disengaged from the gear portions 212 of the timing pulley 210 by the first and second upper alignment rollers 262 and 264.

Further, the upper alignment units 260 may include upper misalignment detection sensors 280 for monitoring positions of the second upper alignment rollers 264 to detect a misalignment state of the timing belts 202. For example, the upper misalignment detection sensors 280 may be disposed adjacent to the upper movable blocks 268, and may monitor positions of rotating shafts of the second upper alignment rollers 264 mounted on the upper movable blocks 268, respectively. Specifically, when the timing belts 202 are out of predetermined positions, the second upper alignment rollers 264 and the upper movable blocks 268 may be moved toward the second upper fixed blocks 272, and the upper misalignment detection sensors 280 may detect the misalignment state of the timing belts 202. In this case, the second upper alignment rollers 264 and the upper movable blocks 268 may be returned to their initial positions by the elastic members 274, thereby aligning the horizontal positions of the timing belts 202.

Figure 8:
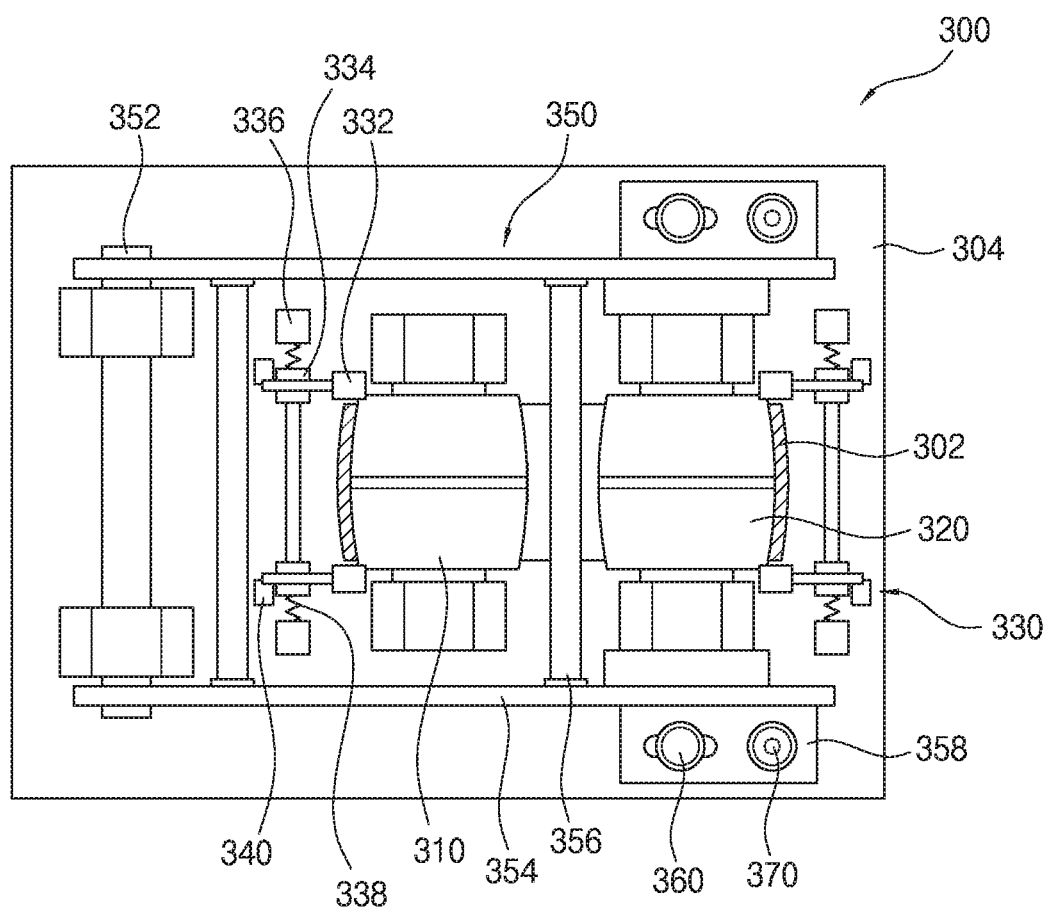
FIG. 8 is a schematic plan view illustrating an auto tensioner as shown in FIG. 1.
Figure 9:
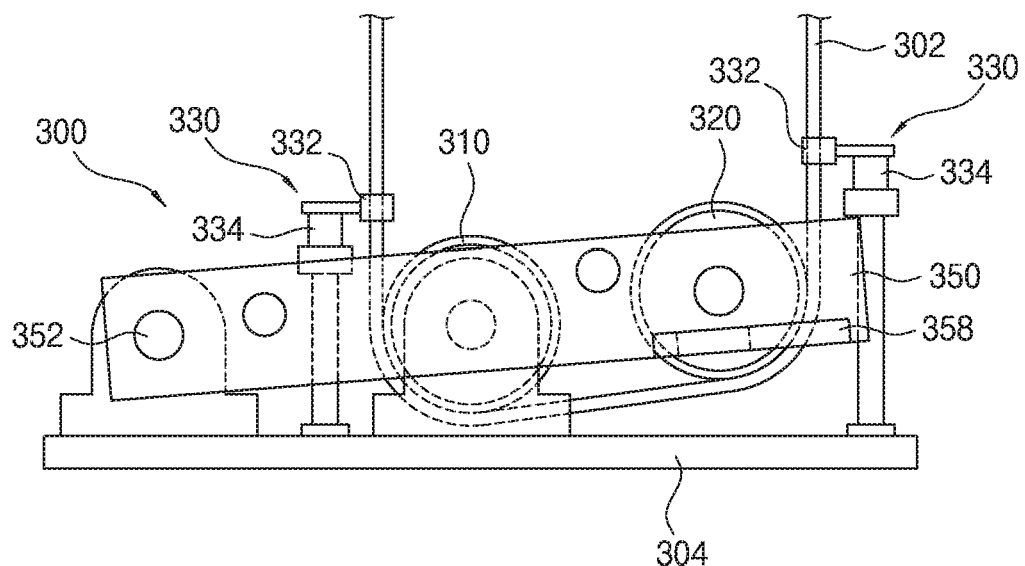
FIG. 9 is a schematic front view illustrating a fixed pulley and a movable pulley as shown in FIG. 8.
Figure 10:
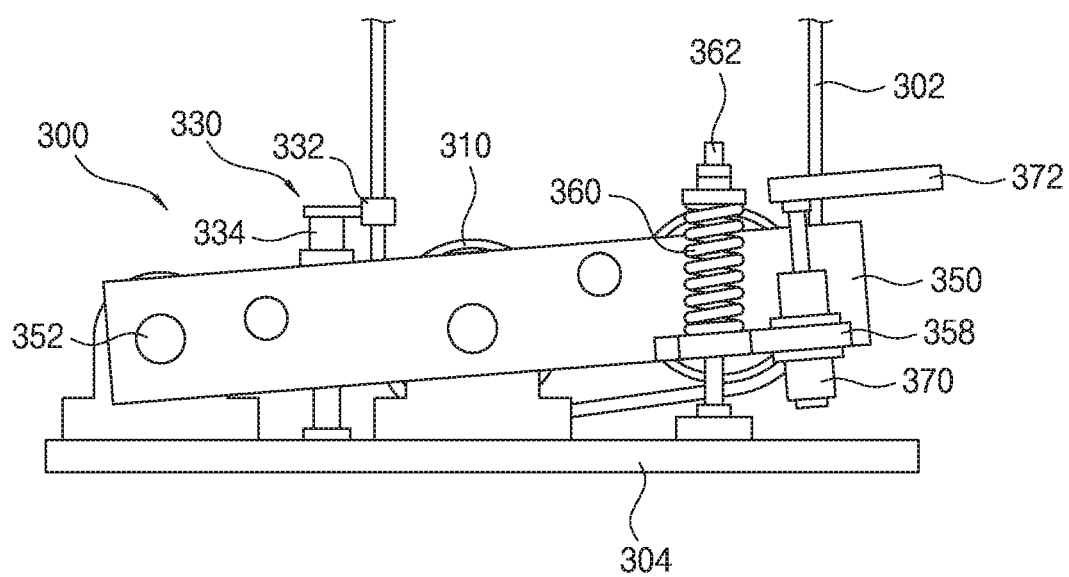
FIG. 10 is a schematic front view illustrating an elastic member and a vibration damper as shown in FIG. 8.

FIG. 8 is a schematic plan view illustrating the auto tensioner 300 as shown in FIG. 1, FIG. 9 is a schematic front view illustrating a fixed pulley 310 and a movable pulley 320 as shown in FIG. 8, and FIG. 10 is a schematic front view illustrating an elastic member 360 and a vibration damper 370 as shown in FIG. 8.

Referring to FIGS. 8 to 10, the auto tensioner 300 may be disposed below the carriage module 110 and the weight module 140 and on the lower plate 108 of the main frame 102. The auto tensioner 300 may include a fixed pulley 310 on which the balance belt 302 is engaged, and a movable pulley 320 disposed adjacent to the fixed pulley 310 and configured to press an inner side of the balance belt 302 downward to maintain a tension of the balance belt 302. Particularly, the tower lift 100 may include lower alignment units 330 for aligning a horizontal position of the balance belt 302. The lower alignment units 330 may be disposed adjacent to the fixed pulley 310 and the movable pulley 320, respectively, to prevent the balance belt 302 from being disengaged from the fixed pulley 310 and the movable pulley 320. Further, the auto tensioner 300 may include a base plate 304 on which the fixed pulley 310 is rotatably mounted, and the lower alignment units 330 may be disposed on the base plate 304.

Each of the lower alignment units 330 may include lower alignment rollers 332 disposed adjacent to both sides of the balance belt 302, respectively, to prevent the balance belt 302 from being disengaged from the fixed pulley 310 or the movable pulley 320, and lower movable blocks 334 to which the lower alignment rollers 332 are mounted respectively and configured to be movable in a direction parallel with a central axis of the fixed pulley 310 and the movable pulley 320. Further, the each of the lower alignment units 330 may include lower fixed blocks 336 disposed on both sides of the lower movable blocks 334, respectively, and elastic members 338 disposed between the lower movable blocks 334 and the lower fixed blocks 336, respectively.

Though not shown in figures, the lower movable blocks 334 may be configured to be movable by a guide mechanism such as a linear motion guide, and coil springs may be used as the elastic members 338.

When the balance belt 302 is laterally disengaged from the fixed pulley 310 or the movable pulley 320, one side of the balance belt 302 may be in close contact with one of the lower alignment rollers 332. In this case, one of the elastic members 338 may provide an elastic restoring force so that the balance belt 302 is moved onto a central portion of the fixed pulley 310 or the movable pulley 320.

The fixed pulley 310 and the movable pulley 320 may have a shape in which the central portion protrudes convexly. That is, the fixed pulley 310 and the movable pulley 320 may have a central portion diameter greater than an edge portion diameter. Accordingly, a state in which the balance belt 302 is aligned with the central portions of the fixed pulley 310 and the movable pulley 320 may be stably maintained.

The lower alignment units 330 may include lower misalignment detection sensors 340 for monitoring positions of the lower alignment rollers 332 to detect a misalignment state of the balance belt 302. For example, the lower misalignment detection sensors 340 may be disposed adjacent to the lower movable blocks 334, and may monitor positions of rotating shafts of the lower alignment rollers 332 mounted on the lower movable blocks 334, respectively.

The auto tensioner 300 may include a movable frame 350 disposed on the base plate 304, and the movable pulley 320 may be rotatably mounted to the movable frame 350. For example, one side of the movable frame 350 may be hingedly coupled onto the base plate 304 by a rotating shaft 352, and the movable pulley 320 may be rotatably mounted to another side of the movable frame 350. For example, the movable frame 350 may include a pair of plates 354 to which the movable pulley 320 is mounted and connecting rods 356 for connecting the pair of plates 354 with each other.

Particularly, elastic members 360 such as coil springs for applying a predetermined tensile force to the balance belt 302 and vibration dampers 370 for reducing vibration of the balance belt 302 may be mounted on the another side of the movable frame 350.

For example, the movable frame 350 may include brackets 358 for mounting the elastic members 360 and vibration dampers 370. Stud members 362 extending in the vertical direction through the brackets 358 and having an upper head may be disposed on the base plate 304, and the elastic members 360 such as coil springs may be disposed between the brackets 358 and the upper heads of the stud members 362. Further, the vibration dampers 370 may be mounted on the brackets 358, and support members 372 for supporting piston rods of the vibration dampers 370 may be mounted on the main frame 102.

In accordance with the exemplary embodiments of the present invention as described above, a tower lift 100 may include a main frame 102 extending in a vertical direction, a carriage module 110 configured to be movable in the vertical direction along the main frame 102, a weight module 140 disposed behind the carriage module 110 and configured to be movable in the vertical direction along the main frame 102, a driving module 200 disposed on the main frame 102 and configured to move the carriage module 110 and the weight module 140 in the vertical direction using timing belts 202, an auto tensioner 300 disposed on a lower portion of the main frame 102 and connected with the carriage module 110 and the weight module 140 by a balance belt 302, and upper alignment units 260 for aligning horizontal positions of the timing belts 202.

Particularly, the upper alignment units 260 may align the horizontal positions of the timing belts 202 using first and second upper alignment rollers 262 and 264 and elastic members 274. Further, the tower lift 100 may include lower alignment units 330 for aligning a horizontal position of the balance belt 302. The lower alignment units 330 may align the horizontal position of the balance belt 302 using lower alignment rollers 332 and elastic members 338. Accordingly, the problems that the timing belts 202 are disengaged from the timing pulley 210 and the balance belt 302 is disengaged from the fixed and movable pulleys 310 and 320 may be solved.

Although a tower lift 100 has been described with reference to specific embodiments, it is not limited thereto. Therefore, it will be readily understood by those skilled in the art that various modifications and changes can be made thereto without departing from the spirit and scope of the present invention defined by the appended claims.

The invention claimed is:

1. A tower lift comprising:
a main frame extending in a vertical direction;
a carriage including a lift frame having a rear surface and at least one support plate configured to be movable in the vertical direction along the main frame;
a weight disposed behind the carriage and configured to be movable in the vertical direction along the main frame;
a driving module disposed on the main frame and configured to move the carriage and the weight in the vertical direction using at least one timing belt;
an auto tensioner disposed on a lower portion of the main frame and connected with the carriage and the weight by a balance belt;

an upper alignment tool configured to align a horizontal position of the at least one timing belt;

at least one brake mounted to the carriage and disposed in close contact with the main frame; and at least one carriage robot mounted to the carriage and disposed on the lift frame, wherein the at least one brake is mounted on the rear surface of the lift frame and configured to activate during a failure mode to prevent the carriage from falling, wherein the at least one carriage robot is mounted to the at least one support plate and configured to transport a receiving container, wherein the driving module comprises a pair of diming belts having a first end portion connected with the carriage and a second end portion connected with the weight, respectively, a timing pulley configured in one piece and having a pair of gear portions engaged with the timing belts, and a motor and a reduction gear connected to a drive shaft coupled to rotate the timing pulley, and wherein the upper alignment tool comprises a first upper alignment roller disposed between the timing belts, second upper alignment rollers disposed on both sides of the pair of timing belts, respectively, an upper fixed block to which the first upper alignment roller is mounted and upper movable blocks to which the second upper alignment rollers are mounted respectively and configured to be movable in a direction parallel with a central axis of the timing pulley.

2. The tower lift of claim 1, wherein the upper alignment tool further comprises:

second upper fixed blocks disposed on both sides of the upper movable blocks, respectively; and elastic members disposed between the upper movable blocks and the second upper fixed blocks, respectively.

3. The tower lift of claim 1, wherein the upper alignment tool further comprises:

upper misalignment detection sensors for monitoring positions of the second upper alignment rollers to detect a misalignment state of the timing belts.

4. The tower lift of claim 1, wherein the auto tensioner comprises:

a fixed pulley disposed below the carriage and the weight and on which the balance belt is engaged; and a movable pulley disposed adjacent to the fixed pulley and configured to press an inner side of the balance belt downward to maintain a tension of the balance belt.

5. The tower lift of claim 4, further comprising a lower alignment tool configured to align a horizontal position of the balance belt.

6. The tower lift of claim 5, wherein the lower alignment tool comprises:

lower alignment rollers disposed adjacent to both sides of the balance belt, respectively, to prevent the balance belt from being disengaged from the fixed pulley; and lower movable blocks to which the lower alignment rollers are mounted respectively and configured to be movable in a direction parallel with a central axis of the fixed pulley.

7. The tower lift of claim 6, wherein the lower alignment tool further comprises:

lower fixed blocks disposed on both sides of the lower movable blocks, respectively; and elastic members disposed between the lower movable blocks and the lower fixed blocks, respectively.

8. The tower lift of claim 6, wherein the lower alignment tool further comprises:

lower misalignment detection sensors for monitoring positions of the lower alignment rollers to detect a misalignment state of the balance belt.

* * * * *